US006717157B2

(12) United States Patent
Utsumi

(10) Patent No.: US 6,717,157 B2
(45) Date of Patent: Apr. 6, 2004

(54) MASK INSPECTING APPARATUS

(75) Inventor: Takao Utsumi, Watchung, NJ (US)

(73) Assignee: LEEPL Corporation, Machida (JP)

( * ) Notice: Subject to any disclaimer, the term of this patent is extended or adjusted under 35 U.S.C. 154(b) by 0 days.

(21) Appl. No.: 10/188,335

(22) Filed: Jul. 3, 2002

(65) Prior Publication Data

US 2004/0004195 A1 Jan. 8, 2004

(51) Int. Cl.[7] .............................................. G03B 27/54
(52) U.S. Cl. ............................ 250/491.1; 250/492.2; 250/492.22; 250/492.3
(58) Field of Search ................................. 250/310, 311, 250/306, 307, 491.1, 492.1, 492.2, 492.22, 492.23, 492.3

(56) References Cited

U.S. PATENT DOCUMENTS 5,717,204 A * 2/1998 Meisburger et al. ........ 250/310
5,831,272 A * 11/1998 Utsumi ..................... 250/492.2
5,923,034 A * 7/1999 Ogasawara et al. ......... 250/311
6,038,015 A * 3/2000 Kawata .................... 250/492.2
6,411,364 B1 * 6/2002 Suzuki ..................... 250/492.2

FOREIGN PATENT DOCUMENTS

JP    2001-227932    8/2001

* cited by examiner

Primary Examiner—John R. Lee
Assistant Examiner—James P. Hughes
(74) Attorney, Agent, or Firm—Nixon Peabody LLP; David S. Safran

(57) ABSTRACT

The mask inspecting apparatus is incorporated into an electron beam proximity exposure apparatus in which a mask is arranged in proximity to a wafer, and a mask pattern formed on the mask is transferred onto a resist layer on the wafer by scanning the mask with an electron beam. The mask inspecting apparatus comprises a scanning electron microscope (SEM) arranged on a wafer stage, and a stage drive device which shifts the wafer stage so that an electron detector of the SEM can receive electrons originating from the electron beam transmitting through the mask pattern of the mask in an inspection of the mask. The SEM thereby capture an image of the mask pattern on the lower face of the mask. Thus, the mask inspection can be performed using an electron beam intended for use in proximity exposure in the electron beam proximity exposure apparatus.

12 Claims, 8 Drawing Sheets

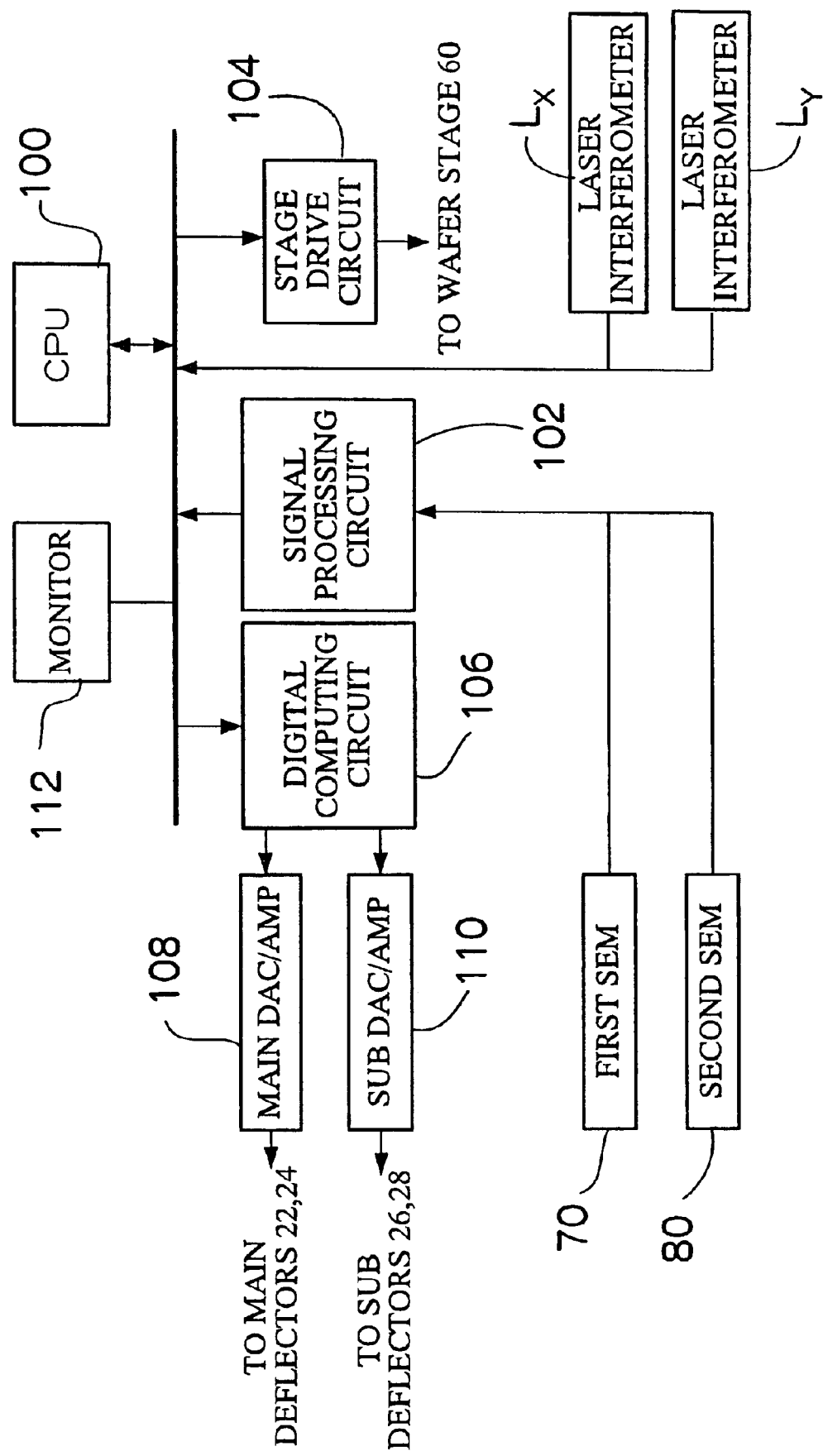

MASK INSPECTING APPARATUS

BACKGROUND OF THE INVENTION

1. Field of the Invention

The present invention relates to a mask inspecting apparatus, and more particularly to a mask inspecting apparatus for use in an electron beam exposure apparatus, which transfers a mask pattern of a stencil mask (a mask with apertures) onto a resist layer on a semiconductor wafer in an equal size using an electron beam.

2. Description of the Related Art

Japanese Patent Application Publication No. 2001-227932 discloses a conventional mask inspecting apparatus, in which a mask is irradiated with a converged electron beam, the electron beam transmitting through the mask is then converted into light on a fluorescent plate, and an optical image resulting from this photo-conversion is converted into image signals with a CCD camera. The mask is then shifted in the X direction and the Y direction so that the whole surface of the mask is scanned with the electron beam, and the image signals picked up by the CCD camera are transferred in synchronism with this shifting of the mask to obtain an image of the whole mask surface.

However, since this conventional mask inspecting apparatus is a dedicated mask inspecting apparatus, it has a problem that it cannot inspect a mask being used in the exposure apparatus.

On the other hand, U.S. Pat. No. 5,831,272 corresponding to Japanese Patent No. 2951947 discloses an electron beam proximity exposure apparatus as an exposure apparatus using this kind of mask. In this electron beam proximity exposure apparatus, the mask is arranged in proximity to the wafer (e.g., with an interval of 50 μm between the mask and the wafer), and the mask is irradiated with an electron beam coming vertically on it and scanned with the electron beam, so that the electron beam transmitting through the mask pattern of the mask can transfer the mask pattern of the mask on to the resist layer on the wafer in an equal size. In some cases, smear sticks to the back face of the mask arranged in proximity to the wafer, however, it is impossible to frequently inspect the mask with the conventional mask inspecting apparatus to detect the smear of the mask or any such trouble, since the mask has to be transferred for the inspection from the exposure apparatus to the inspecting apparatus.

SUMMARY OF THE INVENTION

The present invention, attempted in view of this circumstance, is intended to provide a mask inspecting apparatus capable of not only inspecting a mask with an electron beam used for proximity exposure utilizing the features of the electron beam proximity exposure apparatus but also obtaining an image of the mask pattern which is the same as the mask pattern actually transferred onto the wafer.

In order to attain the object stated above, the present invention is directed to a mask inspecting apparatus incorporated into an electron beam proximity exposure apparatus in which a mask is arranged in proximity to a wafer, and a mask pattern formed on the mask is transferred onto a resist layer on the wafer by scanning the mask with an electron beam, the mask inspecting apparatus comprising: an electron beam image-capturing device arranged on one of a wafer stage on which the wafer is to be mounted and an inspecting stage, the electron beam image-capturing device receiving electrons originating from the electron beam transmitting through the mask pattern of the mask so as to capture an image of the transmitting electron beam; and a stage drive device which shifts the one of the wafer stage and the inspecting stage so that the electrons are brought to incidence on the electron beam image-capturing device when the mask is inspected.

According to the present invention, by shifting the electron beam image-capturing device using the wafer stage or inspecting stage, the electron beam for use in proximity exposure can be used to examine the state of the electron beam transmitting through the mask (i.e. the state of the mask pattern of the mask).

The electron beam image-capturing device may comprise a scanning electron microscope which receives secondary electrons generated from an edge portion on a lower face of the mask pattern of the mask.

Alternatively, the electron beam image-capturing device may comprise: a fluorescent plate provided at substantially the same height as an upper face of the wafer to be mounted on the wafer stage; and a microscopic image-capturing device which magnifies and captures an image produced on the fluorescent plate. In this case, the same image as the mask pattern actually transferred onto the wafer can be obtained. Furthermore, by monitoring an image captured through the electron beam image-capturing device, it can be monitored whether or not the mask is satisfactory and the state of the mask pattern.

Preferably, the electron beam proximity exposure apparatus comprises a control device which controls an angle of incidence of the electron beam on the mask pattern to compensate any distortion of the mask according to the image captured through the electron beam image-capturing device. Thus, even if the mask is distorted, an undistorted mask pattern could be transferred by exposure onto the wafer by controlling the angle of incidence of the electron beam on the mask pattern. It would also be possible to obtain the same mask pattern as the mask pattern transferred by exposure on the wafer by the electron beam image-capturing device according to the position of scanning with the electron beam, therefore enabling the angle of incidence of the electron beam to be determined so as not to distort the mask pattern transferred by exposure onto the wafer on the basis of that image.

Preferably, the mask inspecting apparatus further comprises an image-capturing device which captures an image of the mask pattern on an upper face of the mask. This enables images representing the mask patterns on the upper and lower faces of the mask to be captured (the line width of the upper face of the mask and that of the lower face of the mask are not necessarily identical), or the mask to be three-dimensionally inspected. The image-capturing device for the mask pattern on the upper face of the wafer is not limited to the electron beam image-capturing device, but a microscopic image-capturing device having a visible light source or the like can as well be used for instance.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 8 is a block diagram of a control unit in the electron beam proximity exposure apparatus in FIG. 1.

DETAILED DESCRIPTION OF THE PREFERRED EMBODIMENTS

A mask inspecting apparatus according to a preferred embodiment of the present invention will be described below with reference to accompanying drawings.

Figure 1:
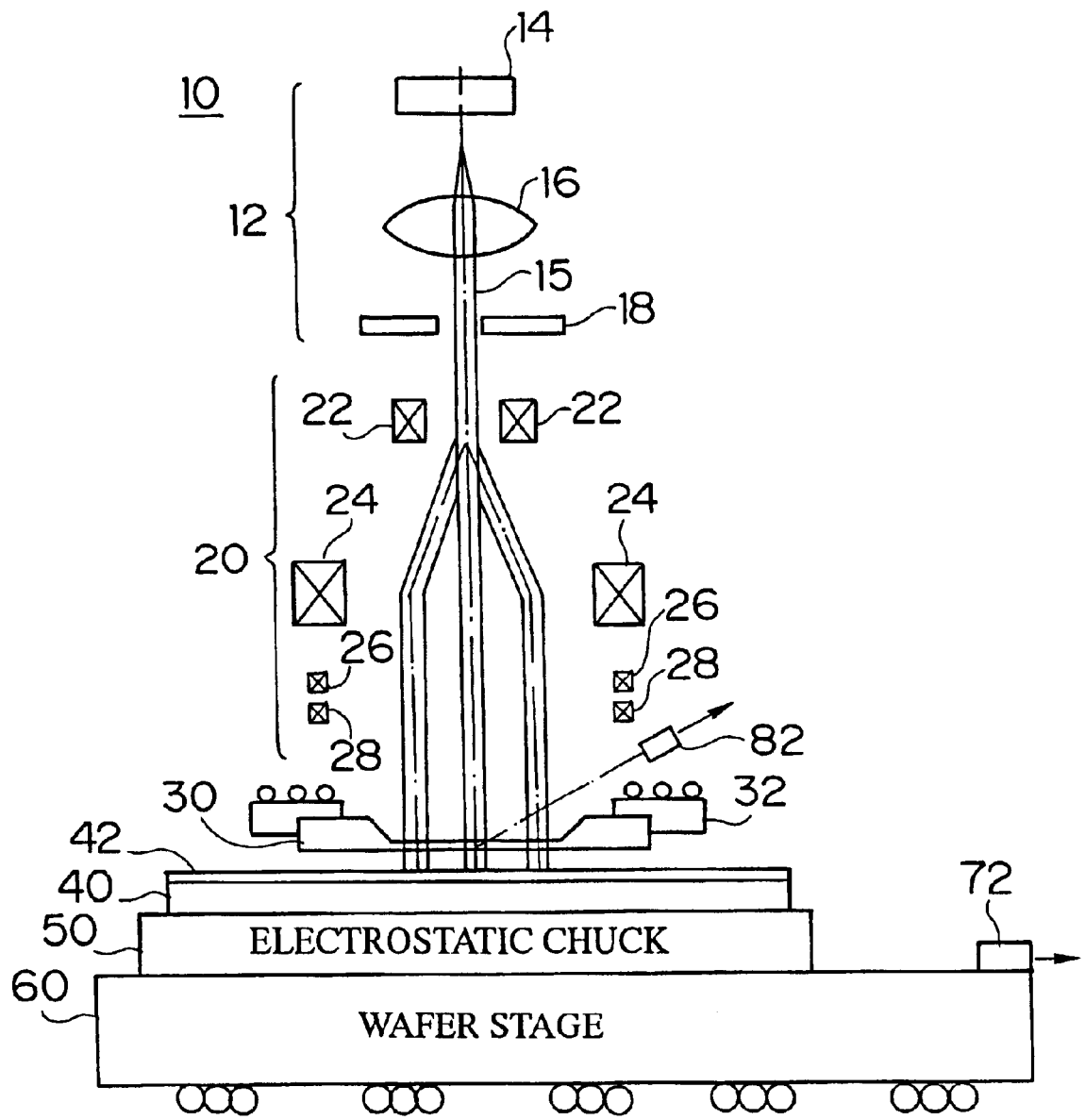
FIG. 1 is a schematic illustration of an electron beam proximity exposure apparatus into which a mask inspecting apparatus according to an embodiment of the invention is incorporated.

FIG. 1 is a schematic illustration of an electron beam proximity exposure apparatus into which a mask inspecting apparatus according to an embodiment of the invention is incorporated.

This electron beam proximity exposure apparatus 10 comprises an electron gun 12 including an electron beam source 14 for generating an electron beam 15, a lens 16 for collimating the electron beam 15, and a shaping aperture 18; a scanning device 20, which includes main deflectors 22 and 24 and sub deflectors 26 and 28 and scans with the electron beam in parallel to the optical axis; a mask 30; a mask stage 32; an electrostatic chuck 50; a wafer stage 60; a first electron beam imaging device or a scanning electron microscope (SEM) having a secondary electron detector 72; and a second SEM having another secondary electron detector 82. This electron beam proximity exposure apparatus 10 is disposed in a vacuum chamber (not shown).

The mask 30 is arranged to be in proximity to a wafer 40 held on the electrostatic chuck 50 so that the interval between the mask 30 and the wafer 40 is, for instance, 50 $\mu$m. When a vertical electron beam is applied to the mask 30 in this state, a resist layer 42 on the wafer 40 is irradiated with the electron beam transmitting through the mask pattern of the mask 30.

Figure 2:
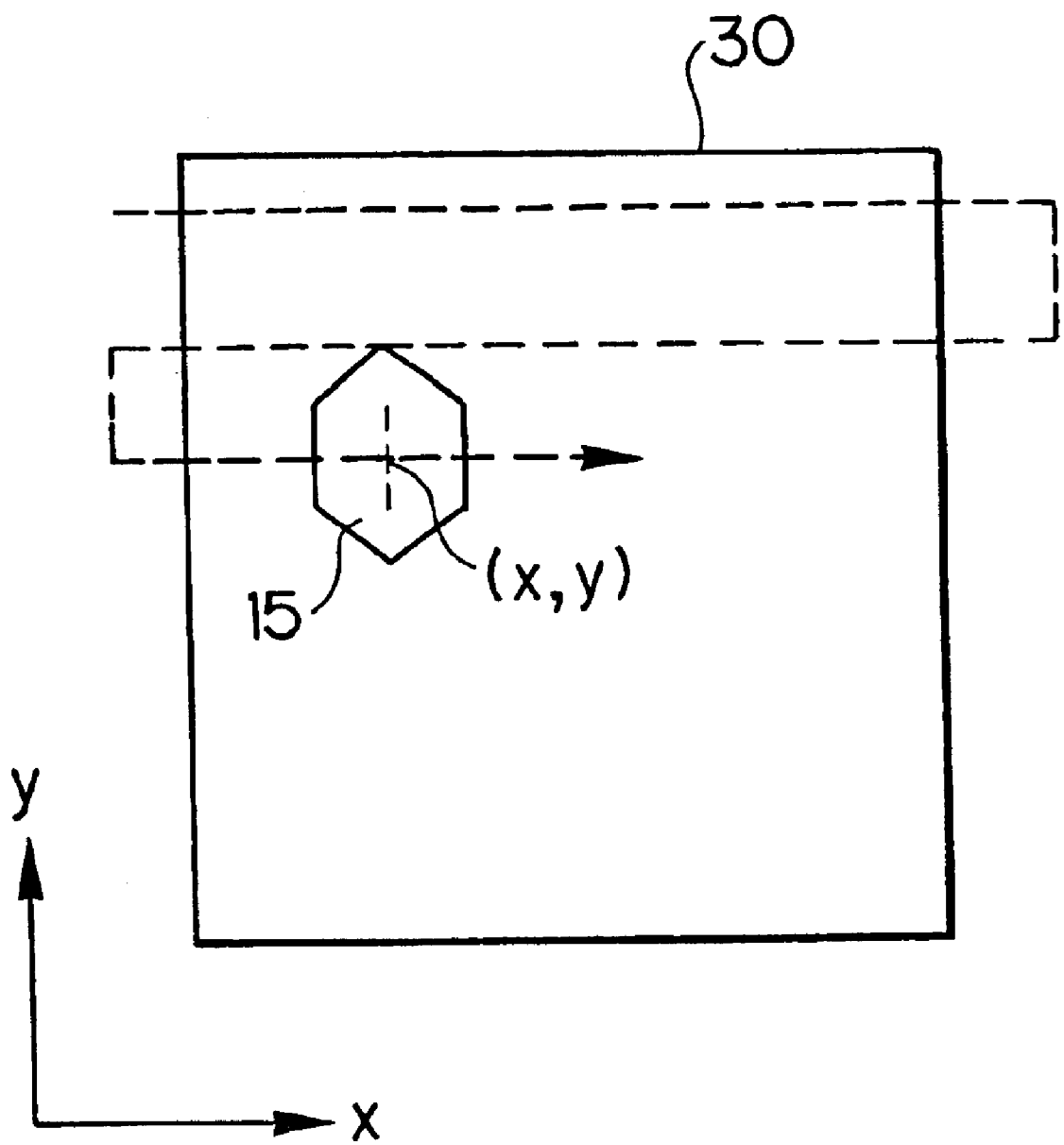
FIG. 2 is a schematic view explaining scanning of a mask with an electron beam.

The scanning device 20 deflectively controls the electron beam 15 so that the whole surface of the mask 30 is scanned with the electron beam 15 as illustrated in FIG. 2. This causes the mask pattern of the mask 30 to be transferred onto the resist layer 42 on the wafer 40 in an equal size. The sectional shape of the electron beam 15 is not limited to what is illustrated in FIG. 2.

Figure 3:
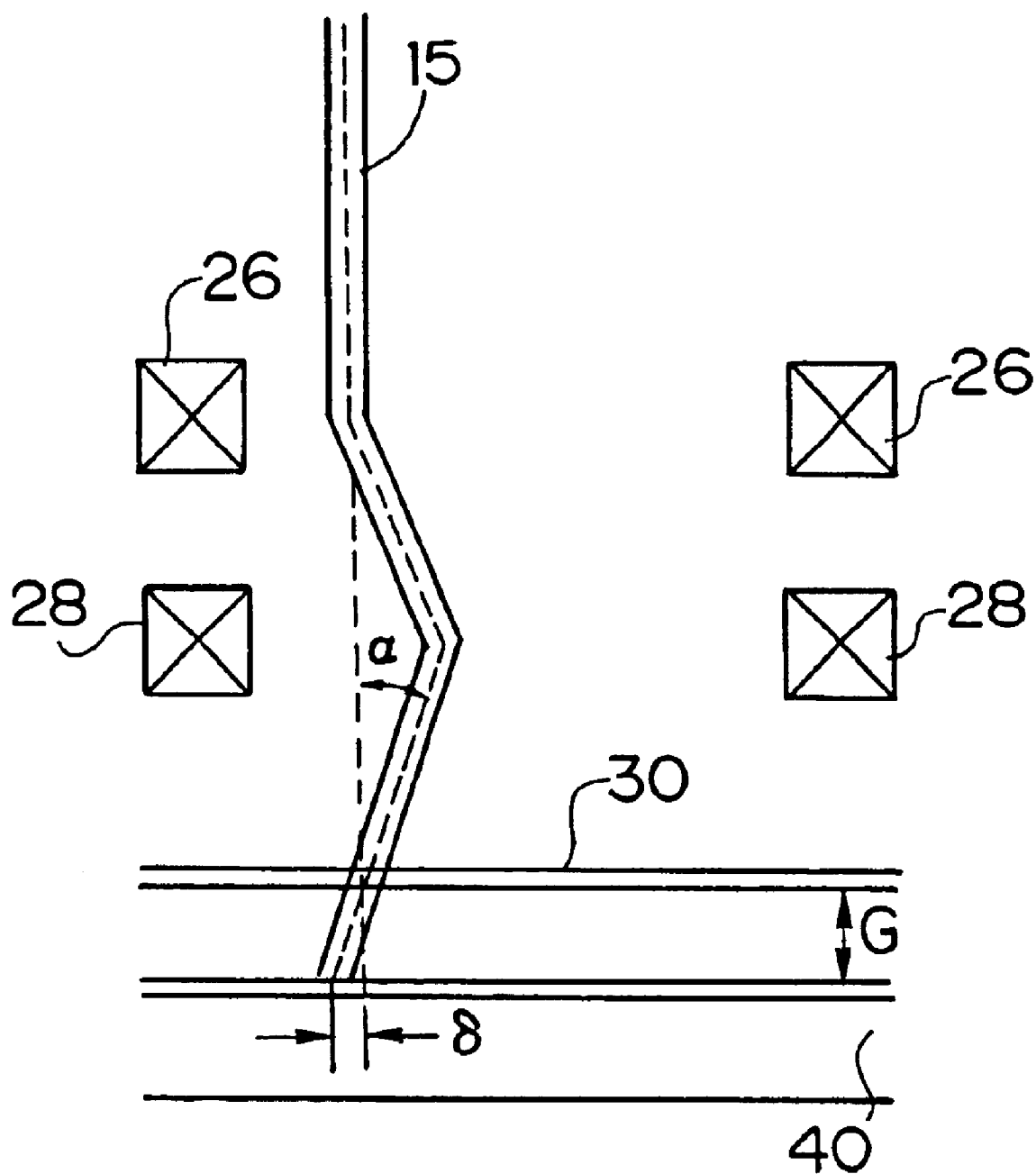
FIG. 3 is a schematic view explaining how the position of transferring with the electron beam is deviated by sub deflectors.

The sub deflectors 26 and 28 of the scanning device 20 are used for fine adjustment of the transferring position of the mask pattern, and control the angle of incidence of the electron beam 15 on the mask 30. As shown in FIG. 3, if the angle of incidence of the electron beam 15 on the mask 30 is $\alpha$ and the interval between the mask 30 and the wafer 40 is G, then the deviation $\delta$ of the position of the transferred mask pattern due to the angle of incidence $\alpha$ is given by:

$$\delta = G \cdot \tan \alpha.$$

In the state illustrated in FIG. 3, the mask pattern is transferred into a position deviating by $\delta$ from its original position.

Figure 4A:
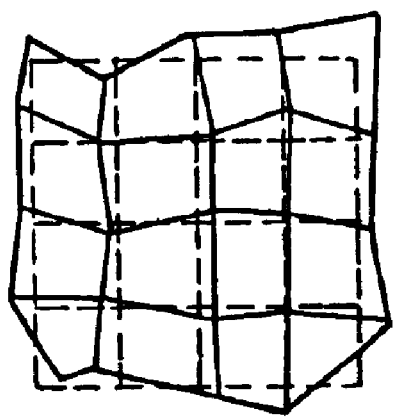
FIGS. 4(A) and 4(B) are schematic views explaining correction of distortion of a mask.
Figure 4A:
Figure 4B:
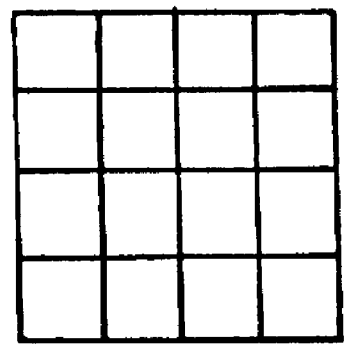

Mask distortion can be compensated by utilizing this positional deviation of the position of the transferred mask pattern due to the angle of incidence $\alpha$ of the electron beam. For instance, even if the mask is distorted as shown in FIG. 4(A), the same mask pattern as the ideal mask undistorted shown in FIG. 4(B) can be transferred by appropriately varying the angle of incidence $\alpha$ of the electron beam 15 on the mask pattern according to the scanning position of the electron beam 15.

The wafer stage 60 shifts the wafer 40 held on the electrostatic chuck 50 in the directions of two axes, horizontal and vertical, and turns the wafer 40 in the horizontal plane. Every time the transferring of a mask pattern in an equal size is completed, the wafer stage 60 shifts the wafer 40 by predetermined quantities, thereby enabling a plurality of mask patterns to be transferred onto one wafer 40.

Figure 5:
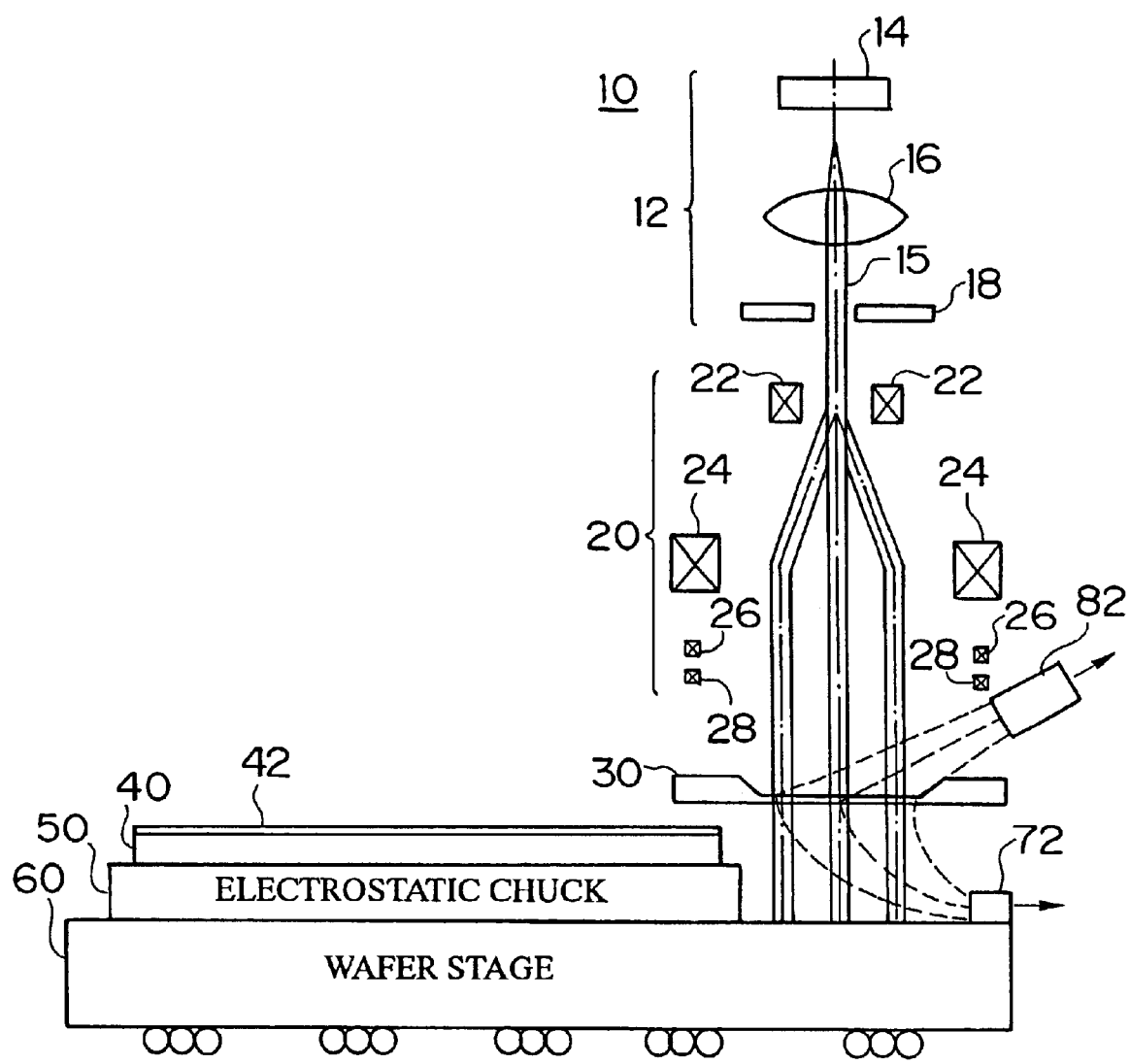
FIG. 5 is a schematic illustration of the state of the electron beam proximity exposure apparatus in FIG. 1 when a mask is being inspected.

The wafer stage 60 is provided with the secondary electron detector 72. When the mask 30 is inspected, the wafer stage 60 shifts the secondary electron detector 72 of the first SEM to a position where the secondary electron detector 72 can receive secondary electrons generated from an edge portion on the lower face of the mask pattern of the mask 30 as shown in FIG. 5.

Figure 6:
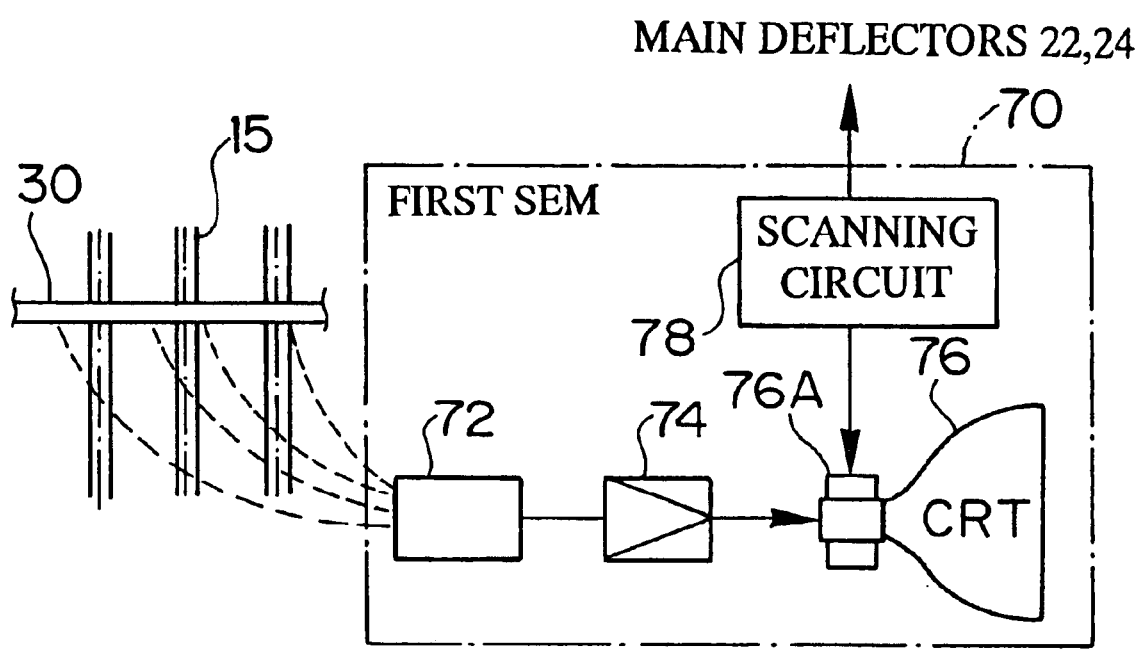
FIG. 6 is a schematic illustration of a configuration of a first scanning electron microscope.

FIG. 6 is a schematic illustration of the configuration of the first SEM.

As shown in FIG. 6, the first SEM comprises the secondary electron detector 72, an amplifier 74, a cathode ray tube (CRT) 76, and a scanning circuit 78.

When the mask 30 is irradiated with the electron beam 15 by the electron beam proximity exposure apparatus so that the whole surface of the mask 30 is scanned, part of the electron beam 15 transmits through the mask pattern of the mask 30. Also, when the electron beam 15 collides against edge portions of the mask patterns on the upper and lower faces of the mask 30, secondary electrons are generated here.

The secondary electrons that are generated from the edge portion of the mask pattern on the lower face are attracted by the potential of the voltage applied to the secondary electron detector 72, and collide against a fluorescent coating over the surface of the secondary electron detector 72 to be converted into light. This light is amplified through a photomultiplier tube, and is further amplified by the amplifier 74 and applied to the CRT 76.

The scanning circuit 78 supplies scanning control signals to the main deflectors 22 and 24 of the electron beam proximity exposure apparatus and to a deflector 76A of the CRT 76 to carry out synchronous scanning so that the position in which the mask 30 is being scanned with the electron beam and the position on the CRT 76 screen correspond with each other.

By capturing image of the screen of the CRT 76, the mask pattern image on the lower face of the mask 30 can be obtained.

Figure 7:
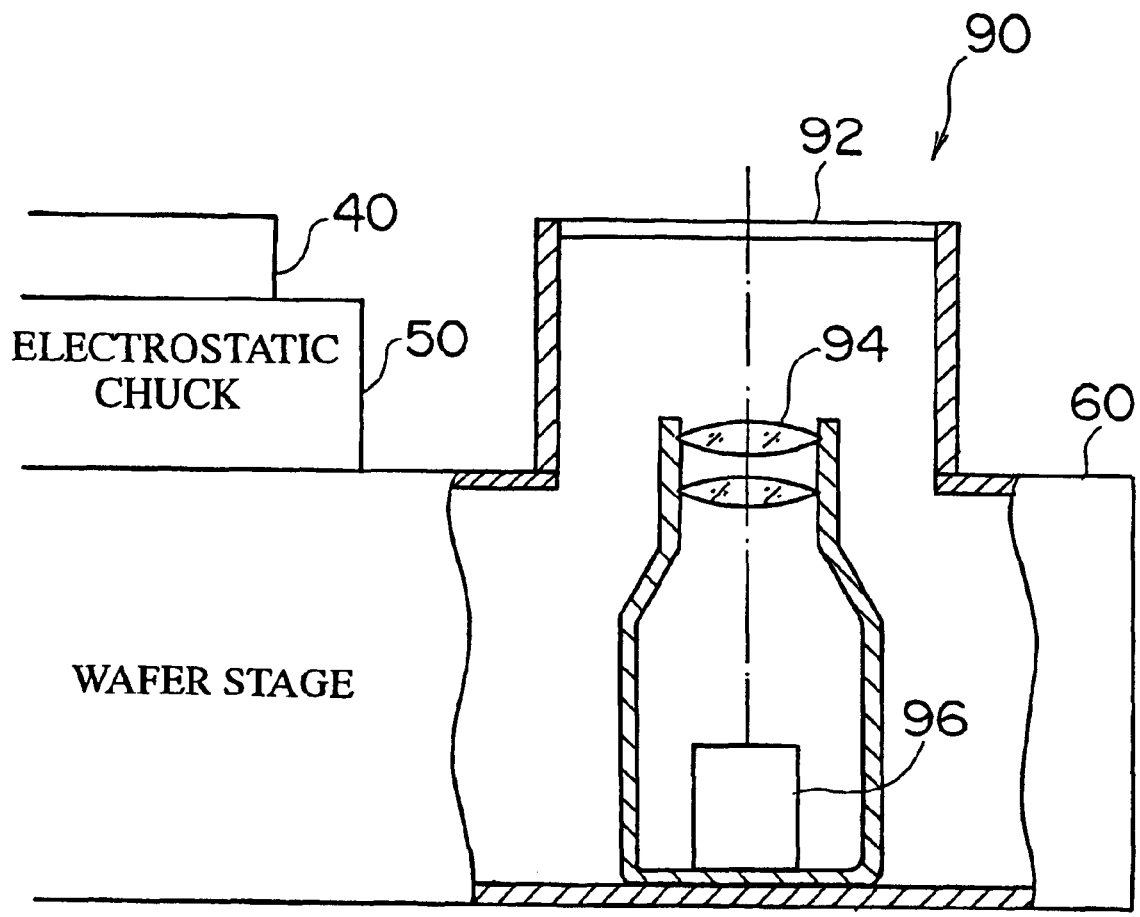
FIG. 7 is a schematic illustration of a configuration of a first electron beam image capturing device in another embodiment.

FIG. 7 is a schematic illustration of the configuration of the first electron beam image-capturing device according to another embodiment of the invention.

As shown in FIG. 7, this first electron beam image-capturing device is a microscopic image-capturing device 90, which comprises a fluorescent plate 92, a microscope objective lens 94 and an image-capturing unit 96.

The fluorescent plate 92 converts the incident electron beam into light, and an incidence plane of the fluorescent plate 92 is set to have the same height as the upper face of the wafer 40 mounted on the wafer stage 60. Therefore, an optical image of the same mask pattern as the mask pattern of the mask 30 transferred onto the wafer 40 is obtained on the fluorescent plate 92. This image on the fluorescent plate 92 is brought to incidence on the image-capturing unit 96 through the microscope objective lens 94 to be captured. An image showing the whole mask pattern of the mask 30 can be captured by, for instance, exposing the image-capturing unit 96 as long as the whole surface of the mask 30 is scanned with the electron beam.

On the other hand, the second SEM is provided at a position where the secondary electron detector 82 can receive secondary electrons generated from the edge portion of the mask pattern on the upper face of the mask 30 as shown in FIG. 5. The configuration of the second SEM in all other respects is the same as that of the first SEM 70 described with reference to FIG. 6 or 7, and accordingly its detailed description is dispensed with.

The second electron beam image capturing device is not limited to the second SEM described above, but may be, for instance, a usual image capturing device (optical microscopic image capturing device) which, when irradiating the mask with a white light beam or some other beam, picks up the resultant reflected light. Since the image capturing device in this case uses no electron beam, it can be provided at a position where the mask 30 is shifted by the mask stage 32 to a position outside the exposing area of electron beam and where the image of the mask 30 can be captured from just above.

FIG. 8 is a block diagram of a control unit in the electron beam proximity exposure apparatus including the mask inspecting apparatus.

In FIG. 8, a central processing unit (CPU) 100 performs general control over the whole apparatus, including control of the wafer positioning and control of the electron beam deflection during wafer exposure or mask inspecting.

The CPU 100 shifts the wafer stage 60 in the x direction and the y direction via a stage drive circuit 104 so as to minimize the positional deviation between the mask 30 and the wafer 40 determined with a measuring device (not shown), and at the same time turns the wafer stage 60 within the xy plane to thereby position the wafer with a high degree of accuracy (fine alignment).

Upon completion of the fine alignment, the CPU 100 supplies a digital computing circuit 106 with quantitative data on deflection in scanning the mask, and the digital computing circuit 106 supplies a main DAC/AMP 108 with digital signals for scanning the mask on the basis of the quantitative data on deflection. The main DAC/AMP 108 converts the entered digital signals into analog signals, and amplifies and supplies the analog signals to the main deflectors 22 and 24 (see FIG. 1). This results in deflection of the electron beam 15 so as to scan the mask 30 all over while maintaining a state of parallelism of the electron beam 15 with the optical axis as shown in FIG. 2.

Further, the CPU 100 supplies the digital computing circuit 106 with correction data for compensating the distortion of the mask 30, and the digital computing circuit 106 supplies a sub DAC/AMP 110 with digital signals for controlling the angle of incidence of the electron beam on the mask 30 on the basis of the correction data. The sub DAC/AMP 110 converts the entered digital signals into analog signals, and amplifies and supplies the analog signals to the sub deflectors 26 and 28 (see FIG. 1). This results in controlling the angle of incidence of the electron beam 15 on the mask 30 as shown in FIG. 3, and making possible transferring of the ideal mask pattern free from mask distortion as described with reference to FIG. 4.

The CPU 100 shifts the wafer stage 60 with the stage drive circuit 104 by a predetermined quantity every time one round of transferring the mask pattern in an equal size is completed, and a plurality of mask patterns are thereby transferred to one wafer 40.

When a new mask is installed or the transferring of a mask pattern onto a preset number (including one) of wafer(s) is completed, the CPU 100 shifts the wafer stage 60 with the stage drive circuit 104 to the mask inspecting position (see FIG. 5). The CPU 100 obtains readings (x, y) from laser interferometers $L_x$ and $L_y$ for measuring the positions of the wafer stage 60 in the x direction and the y direction, so that the CPU 100 can control the shifting of the wafer stage 60 to an appropriate position on the basis of the readings (x, y) from the laser interferometers $L_x$ and $L_y$ after fine alignment.

When the wafer stage 60 reaches the mask inspecting position, the CPU 100 controls the deflection of the electron beam so that the mask 30 is scanned with the electron beam all over in the same way as in transferring the mask pattern to the wafer.

The first SEM 70, as described above, captures the image of the electron beam transmitting through the mask 30 and supplies a signal processing circuit 102 with first image signals representing the mask pattern on the lower face of the mask 30. On the other hand, the second SEM 80 supplies the signal processing circuit 102 with second image signals representing the mask pattern on the upper face of the mask 30.

The signal processing circuit 102 causes an image representing the mask pattern on the lower face of the mask 30 to be displayed on a monitor 112 according to the entered first image signals. The operator, by watching the image of the mask pattern displayed on the monitor 112, can examine whether or not the mask 30 is satisfactory.

Also, the signal processing circuit 102 can automatically determine whether or not the mask 30 is satisfactory, by comparing the image representing the mask pattern based on the entered first image signals with the reference image of the mask pattern, and cause the result of determination to be displayed on the monitor 112. Furthermore, the signal processing circuit 102 can cause an image representing the mask pattern on the upper face of the mask 30 to be displayed on the monitor 112 on the basis of the entered second image signals, or carry out a three-dimensional inspection by inspecting both faces of the mask 30 on the basis of the aforementioned first and second image signals.

The CPU 100 can measure any distortion of the mask with the image representing the mask pattern captured by the first SEM 70, and thereby figure out correction data for compensating the measured distortion of the mask. In the measurement of the mask distortion, the sub DAC/JAMP 110 does not change the angle of incidence of the electron beam on the mask 30.

Although this embodiment of the invention is provided with the first SEM 70 and the second SEM 80, the first SEM 70 alone can suffice. Also, although the first SEM 70 is provided on the wafer stage 60 in this configuration, the position of the first SEM 70 is not limited to this, but another shiftable stage (inspecting stage) than the wafer stage 60 may be provided. In this case, for example, when the mask is to be inspected, the wafer stage 60 is set aside and the inspecting stage is shifted so that the electron beam transmitting the mask pattern of the mask can be caught by the first SEM 70.

As hitherto described, the mask inspecting apparatus according to the present invention takes advantage of the features of the electron beam proximity exposure apparatus, so that the mask inspecting apparatus can inspect the mask with the electron beam for use in proximity exposure by arranging an electron beam image-capturing device on the wafer stage for mounting a wafer or on an inspecting stage. Furthermore, the incidence plane of the electron beam/light converting device, which converts the electron beam incident to the electron beam image-capturing device into light, is arranged at the same height as the upper face of the wafer to be mounted on the wafer stage, an image of the same mask pattern can be captured as the mask pattern actually transferred onto the wafer.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A mask inspecting apparatus incorporated into an electron beam proximity exposure apparatus in which a mask is arranged in proximity to a wafer, and a mask pattern formed on the mask is transferred onto a resist layer on the wafer by scanning the mask with an electron beam, the mask inspecting apparatus comprising:

an electron beam image-capturing device arranged on one of a wafer stage on which the wafer is to be mounted and an inspecting stage, the electron beam image-capturing device receiving electrons originating from the electron beam transmitting through the mask pattern of the mask so as to capture an image of the transmitting electron beam; and a stage drive device which shifts the one of the wafer stage and the inspecting stage so that the electrons are brought to incidence on the electron beam image-capturing device when the mask is inspected.

2. The mask inspecting apparatus as defined in claim 1, wherein said electron beam image-capturing device includes an image-capturing device which captures an image of the mask pattern on an upper face of the mask.

3. The mask inspecting apparatus as defined in claim 1, wherein the electron beam proximity exposure apparatus comprises a control device which controls an angle of incidence of the electron beam on the mask pattern to compensate any distortion of the mask according to the image captured through the electron beam image-capturing device.

4. The mask inspecting apparatus as defined in claim 3, wherein said electron beam image-capturing device includes an image-capturing device which captures an image of the mask pattern on an upper face of the mask.

5. The mask inspecting apparatus as defined in claim 1, wherein the electron beam image-capturing device, comprising a scanning electron microscope, receives secondary electrons generated from an edge portion on a lower face of the mask pattern of the mask.

6. The mask inspecting apparatus as defined in claim 5, wherein said electron beam image-capturing device includes an image-capturing device which captures an image of the mask pattern on an upper face of the mask.

7. The mask inspecting apparatus as defined in claim 5, wherein the electron beam proximity exposure apparatus comprises a control device which controls an angle of incidence of the electron beam on the mask pattern to compensate any distortion of the mask according to the image captured through the electron beam image-capturing device.

8. The mask inspecting apparatus as defined in claim 7, wherein said electron beam image-capturing device includes an image-capturing device which captures an image of the mask pattern on an upper face of the mask.

9. The mask inspecting apparatus as defined in claim 1, wherein the electron beam image-capturing device comprises:

a fluorescent plate provided at substantially the same height as an upper face of the wafer to be mounted on the wafer stage; and a microscopic image-capturing device which magnifies and captures an image produced on the fluorescent plate.

10. The mask inspecting apparatus as defined in claim 9, wherein said electron beam image-capturing device includes an image-capturing device which captures an image of the mask pattern on an upper face of the mask.

11. The mask inspecting apparatus as defined in claim 9, wherein the electron beam proximity exposure apparatus comprises a control device which controls an angle of the electron beam on the mask pattern to compensate any distortion of the mask according to the image captured through the electron beam image-capturing device.

12. The mask inspecting apparatus as defined in claim 11, wherein said electron beam image-capturing device includes an image-capturing device which captures an image of the mask pattern on an upper face of the mask.

* * * * *